(12) United States Patent
Suzuki

(10) Patent No.: US 7,297,719 B2
(45) Date of Patent: *Nov. 20, 2007

(54) METHOD AND INTEGRATED SYSTEM FOR PURIFYING AND DELIVERING A METAL CARBONYL PRECURSOR

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/277,910

(22) Filed: Mar. 29, 2006

(65) Prior Publication Data

US 2007/0231241 A1 Oct. 4, 2007

(51) Int. Cl.
*C07C 27/00* (2006.01)

(52) U.S. Cl. ...................................... 518/700

(58) Field of Classification Search ............... None
See application file for complete search history.

(56) References Cited

U.S. PATENT DOCUMENTS

| | | | |
|---|---|---|---|
| 4,851,895 A | 7/1989 | Green et al. | |
| 5,108,983 A | 4/1992 | Lackey, Jr. et al. | |
| 5,171,610 A | 12/1992 | Liu | |
| 5,312,509 A | 5/1994 | Eschbach | |
| 5,553,395 A | 9/1996 | Wen et al. | |
| 5,904,771 A | 5/1999 | Tasaki et al. | |
| 5,914,001 A | 6/1999 | Hansen | |
| 6,303,809 B1 | 10/2001 | Chi et al. | |
| 6,319,832 B1 | 11/2001 | Uhlenbrock et al. | |
| 6,428,623 B2 | 8/2002 | Westmoreland et al. | |
| 6,440,495 B1 | 8/2002 | Wade et al. | |
| 6,544,345 B1 | 4/2003 | Mayer et al. | |
| 6,605,735 B2 | 8/2003 | Kawano et al. | |
| 6,660,328 B1 | 12/2003 | Dahmen et al. | |
| 6,701,066 B2 | 3/2004 | Sandhu | |
| 6,713,373 B1 | 3/2004 | Omstead | |
| 6,718,126 B2 | 4/2004 | Lei | |
| 6,740,586 B1 | 5/2004 | Wang et al. | |
| 2003/0129306 A1 | 7/2003 | Wade et al. | |
| 2004/0013577 A1 | 1/2004 | Ganguli et al. | |
| 2004/0105934 A1 | 6/2004 | Chang et al. | |
| 2004/0241321 A1 | 12/2004 | Ganguli et al. | |
| 2005/0070100 A1 | 3/2005 | Yamasaki et al. | |
| 2005/0081882 A1 | 4/2005 | Greer et al. | |
| 2005/0110142 A1 | 5/2005 | Lane et al. | |
| 2005/0186341 A1 | 8/2005 | Hendrix et al. | |

FOREIGN PATENT DOCUMENTS

| | | |
|---|---|---|
| EP | 0714999 A1 | 6/1996 |
| WO | WO2004010463 A2 | 1/2004 |

OTHER PUBLICATIONS

C. Czekaj et al., Chemical Vapor Deposition of FeCox and FeCoxOy, Thin Films from Fe—Co Carbonyl Clusters, Inorg. Chem. 1988, 27, pp. 8-10.

*Primary Examiner*—Yvonne Eyler
*Assistant Examiner*—M Louisa Lao
(74) *Attorney, Agent, or Firm*—Wood, Herron & Evans, LLP

(57) ABSTRACT

A method and integrated system are provided for purifying and delivering a metal carbonyl precursor utilized to process a substrate. The method includes providing the metal carbonyl precursor containing un-reacted metal carbonyl precursor and metal-containing impurities in a metal precursor vaporization chamber containing a precursor collection plate, evacuating the metal precursor vaporization chamber, pressurizing the metal precursor vaporization chamber with a CO-containing gas, vaporizing the un-reacted metal carbonyl precursor, and condensing the vaporized un-reacted metal carbonyl precursor as a purified metal carbonyl precursor on the precursor collection plate. The method may further include vaporizing the purified metal carbonyl precursor, and delivering a process gas containing the vapor of the purified metal carbonyl precursor by flowing a gas containing CO through the metal precursor vaporization chamber to a deposition system configured to expose a substrate to the process gas.

23 Claims, 10 Drawing Sheets

METHOD AND INTEGRATED SYSTEM FOR PURIFYING AND DELIVERING A METAL CARBONYL PRECURSOR

CROSS REFERENCE TO RELATED APPLICATIONS

The present invention is related to U.S. patent application Ser. No. 11/095,448, entitled "METHOD AND SYSTEM FOR REFURBISHING A METAL CARBONYL PRECURSOR," filed Mar. 31, 2005, and U.S. patent application Ser. No. 11/238,501, entitled "METHOD FOR PURIFYING A METAL-CARBONYL PRECURSOR," filed Sep. 28, 2005, the entire contents of which are herein incorporated by reference.

FIELD OF THE INVENTION

The present invention relates to materials processing, and more particularly, to a method and integrated system for purifying and delivering a metal carbonyl precursor used to process a substrate.

BACKGROUND OF THE INVENTION

Manufacturing of integrated circuits includes deposition of various materials onto patterned substrates such as silicon wafers. These materials include metal and metal-containing layers, for example diffusion barriers/liners to prevent diffusion of copper (Cu) conducting layers into dielectric materials and seed layers to promote adhesion and growth of the Cu layers onto the substrate. As the minimum feature sizes of patterned substrates continue to shrink, deposition processes are required that can provide advanced layers onto high-aspect ratio structures at sufficiently low temperatures.

Chemical vapor deposition (CVD) has seen increasing use for preparation of coatings and thin layers in semiconductor wafer processing. CVD is a favored deposition method in many respects, for example, because of its ability to provide highly conformal and high quality layers at relatively fast processing times. Further, CVD is beneficial in depositing layers on substrates of irregular shapes including the provision of highly conformal layers even with respect to deep contacts and other openings. In general, CVD techniques involve the delivery of gaseous precursors (reactants) to the surface of a substrate where chemical reactions take place under temperature and pressure conditions that are favorable to the thermodynamics of the desired reaction. The type and composition of layers that can be formed using CVD can be affected by the ability to deliver the reactants or reactant precursors to the surface of the substrate.

In order for the device manufacturing process to be practical, the deposition processes need to be carried out in a reasonable amount of time. This requirement can necessitate efficient delivery of a precursor containing a metal element from a metal precursor vaporization system to a process chamber containing the substrate(s) to be processed. A common problem encountered in the deposition of metals and metal-containing materials by CVD techniques are low deposition rates onto a substrate due to low vapor pressure of the metal-containing precursor and the transport issues associated therewith, thereby making the deposition process impractical. A low vapor pressure can limit the flow of the metal-containing precursor from the metal precursor vaporization system through gas lines to a process chamber of a deposition system where a substrate is exposed to the metal-containing precursor.

The delivery of metal-containing precursors in CVD processing can be carried out using the sublimator/bubbler method where the precursor is usually placed in a metal precursor vaporization system that is then heated to transform the precursor into a gaseous compound (vapor), which is then transported into the process chamber, often using a carrier gas. However, this procedure has not been able to reliably and reproducibly deliver the precursor to the process chamber for a number of reasons. The major problems with the technique are centered on the inability to consistently vaporize a solid precursor at a controlled rate such that a reproducible flow of precursor vapor can be delivered to the process chamber. Also, it is difficult to ensure complete saturation of the fast moving carrier gas stream because of the limited amount of exposed surface area of the solid precursor in the metal precursor vaporization system and a lack of uniform temperature to provide maximum sublimation/evaporation. In addition, the temperature to which the solid precursor can be heated to provide adequate vapor pressure can be limited by premature decomposition of the precursor at that temperature. Decomposition or partial reaction of the solid precursor in the metal precursor vaporization system can further complicate the precursor delivery due to low or negligible vapor pressure of the partially reacted precursor compared to the un-reacted (fresh) precursor. In addition, a metal-containing precursor may contain metal-containing particulates that may be transferred to the process chamber and can accumulate on the substrate.

Thus, the presence of metal-containing impurities in metal-containing precursors may require purifying the precursor prior to processing substrates. Current separation methods include dissolving the un-reacted precursor using a liquid solvent (e.g., acetone, toluene, etc) and filtering the metal-containing impurities from the solvent. This method commonly require long process times and large amounts of the solvent due to low solubility of the metal-containing impurities in the solvent.

SUMMARY OF THE INVENTION

Embodiments of the invention provide a method and integrated system for purifying and delivering a metal carbonyl precursor used to process a substrate, including a process of depositing a metal or metal-containing layer on a substrate. An as-received or used (old) metal carbonyl precursor can contain metal-containing impurities, including partially reacted metal carbonyl precursor and metal-containing particulate impurities such as metal particles. The purified metal carbonyl precursor contains significantly lower amounts of the metal-containing impurities, thereby allowing efficient delivery of a high purity metal carbonyl precursor and deposition of metal or metal-containing layers with low amounts of metal-containing impurities. Embodiments of the invention can include various metal carbonyl precursors with the general formula $M_x(CO)_y$. The metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, and $Os_3(CO)_{12}$.

According to one embodiment of the invention, the method includes providing a metal carbonyl precursor containing un-reacted metal carbonyl precursor and metal-containing impurities in a metal precursor vaporization chamber containing a precursor collection plate such that the metal carbonyl precursor is spaced from the precursor collection plate, evacuating the metal precursor vaporization chamber, pressurizing the metal precursor vaporization chamber with a CO-containing gas, vaporizing the un-reacted metal carbonyl precursor, and condensing the vaporized un-reacted metal carbonyl precursor as a purified metal carbonyl precursor on the precursor collection plate, whereby at least a portion of the metal-containing impurities remain spaced from the precursor collection plate. According to another embodiment of the invention, the method further includes vaporizing the purified metal carbonyl precursor, and delivering a process gas containing the vapor of the purified metal carbonyl precursor by flowing a carrier gas containing CO through the metal precursor vaporization chamber to a deposition system configured to expose a substrate to the process gas.

According to another embodiment of the invention, the method includes providing a metal carbonyl precursor containing un-reacted metal carbonyl precursor and metal-containing impurities in a metal precursor vaporization chamber containing first and second precursor collection plates such that the metal carbonyl precursor is spaced from the collection plates, and the collection plates are spaced from each other, evacuating the metal precursor vaporization chamber, pressurizing the metal precursor vaporization chamber with a CO-containing gas, heating the metal carbonyl precursor to a first vaporization temperature to vaporize the un-reacted metal carbonyl precursor, condensing the vaporized un-reacted metal carbonyl precursor as a purified metal carbonyl precursor on the first precursor collection plate maintained at a first condensation temperature that is less than the first vaporization temperature, adjusting the temperature of the first precursor collection plate from the first condensation temperature to a second vaporization temperature to vaporize the purified metal carbonyl precursor, and condensing the vaporized purified metal carbonyl precursor as a further purified metal carbonyl precursor on the second precursor collection plate maintained at a second condensation temperature that is less than the second vaporization temperature. According to another embodiment of the invention, the method further includes vaporizing the further purified metal carbonyl precursor, and delivering a process gas containing the vapor of the further purified metal carbonyl precursor by flowing a carrier gas containing CO through the metal precursor vaporization chamber to a deposition chamber configured to expose a substrate to the process gas.

DETAILED DESCRIPTION OF SEVERAL EMBODIMENTS

Figure 1A:
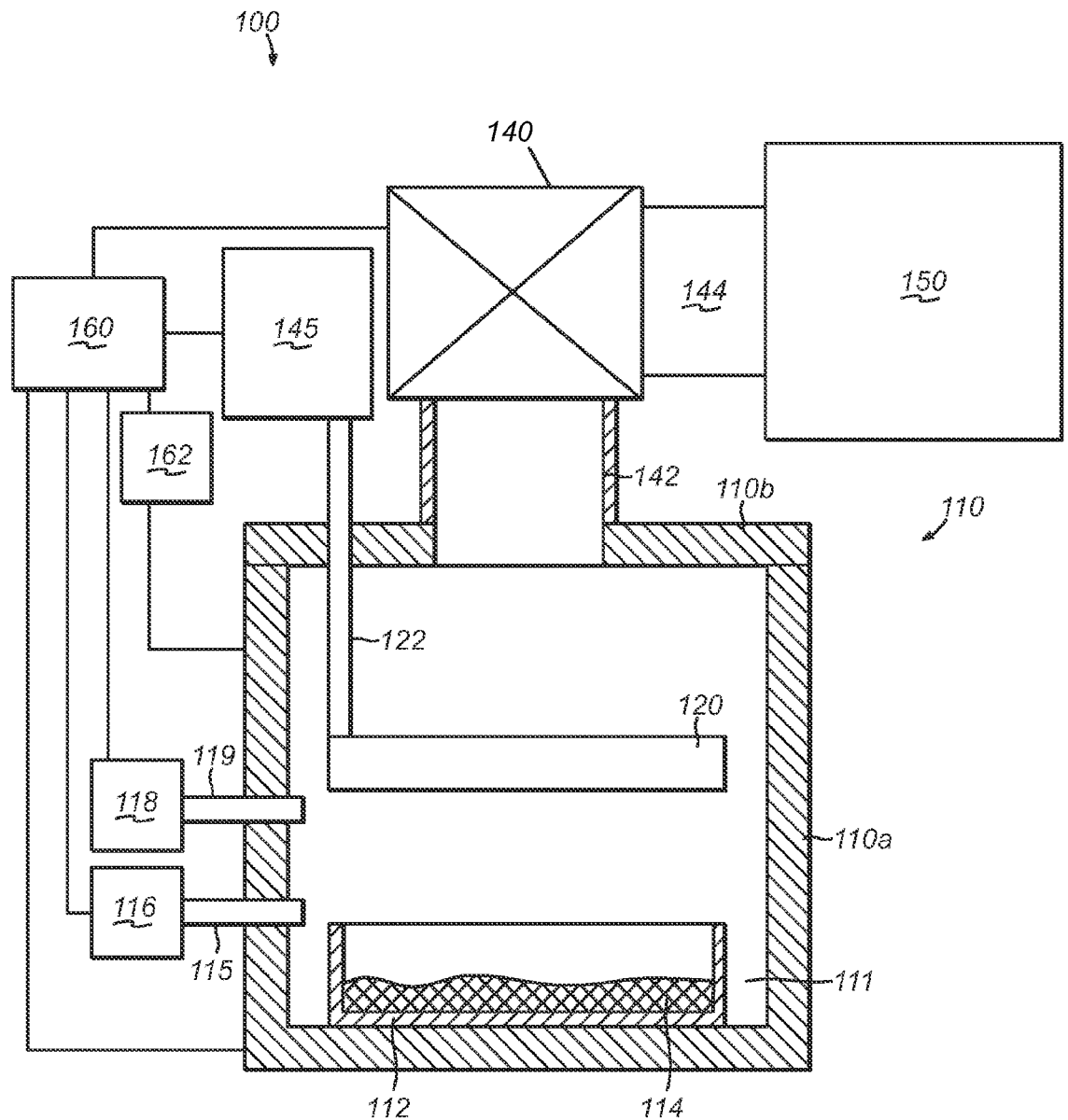
FIGS. 1A-1B each depict a schematic view of an integrated system for purifying and delivering a metal carbonyl precursor according to an embodiment of the invention.

Embodiments of the current invention provide a method and integrated system for purifying and delivery of a metal carbonyl precursor used to process a substrate in a deposition system. Exemplary deposition systems can include, for example, any of the deposition systems described in co-pending U.S. patent application Ser. No. 10/996,145, entitled METHOD FOR INCREASING DEPOSITION RATES OF METAL LAYERS FROM METAL-CARBONYL PRECURSORS, and U.S. patent application Ser. No. 10/996,144, entitled METHOD AND DEPOSITION SYSTEM FOR INCREASING DEPOSITION RATES OF METAL LAYERS FROM METAL-CARBONYL PRECURSORS, each filed Nov. 23, 2004 and the entire contents of which are herein incorporated by reference.

According to embodiments of the invention, the metal carbonyl precursor can, for example, have the general formula $M_x(CO)_y$ (where M is a metal, CO is carbon monoxide, and x and y are integers). The metal carbonyl precursor can include a tungsten carbonyl, a nickel carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof. These metal carbonyls can include, but are not limited to, $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof. In general, the metal carbonyl precursor can be any precursor that contains a metal atom and a CO group.

Co-pending U.S. patent application Ser. No. 11/095,448, entitled "METHOD AND SYSTEM FOR REFURBISHING A METAL-CARBONYL PRECURSOR," filed Mar. 31, 2005, describes that partial decomposition of a metal carbonyl precursor (e.g., $Ru_3(CO)_{12}$) can contribute to the inability to provide a reproducible flow of un-reacted metal carbonyl precursor vapor to a process chamber for depositing a metal or metal-containing layer on a substrate. A fresh metal carbonyl precursor can, over time, partially decompose to form a partially decomposed precursor (e.g., $M_x(CO)_{y-z}$, where $z \geq 1$). Since the un-reacted precursor and partially decomposed precursor can have different vapor pressures, the precursor vapor cannot be reliably and reproducibly sublimated/evaporated in the metal precursor vaporization chamber and delivered to the process chamber. In addition, metal carbonyl precursors can contain expensive precious metals, thus requiring that the partially reacted precursor be separated from the un-reacted precursor and recycled for producing a fresh precursor batch.

Co-pending U.S. patent application Ser. No. 11/238,501, entitled "METHOD FOR PURIFYING A METAL-CARBONYL PRECURSOR," filed Sep. 28, 2005, describes how the use of an as-received (from a chemical supplier) metal carbonyl precursor containing un-reacted metal carbonyl precursor and metal-containing impurities in a heated metal precursor vaporization chamber can contribute to the inability to provide a reproducible flow of un-reacted metal carbonyl precursor vapor to a process chamber for depositing a metal or metal-containing layer with low particle counts on a substrate. In one example, as-received ruthenium carbonyl precursor can contain partially decomposed $Ru_3(CO)_{12}$ and Ru metal particulates. In this example, the as-received $Ru_3(CO)_{12}$ precursor can be highly pure with respect to total Ru content but not with respect to un-reacted $Ru_3(CO)_{12}$. In another example, the metal particulate impurity can contain a different metal than found in the metal carbonyl precursor, for example Fe particulate impurity in a solid $Ru_3(CO)_{12}$ precursor. In general, the metal particulate impurity can contain any metal or metal-containing material (e.g., metal oxide, metal nitride, metal carbide), including, but not limited to, transition metals, alkali metals, and alkali earth metals. The metal particulate impurities can be non-volatile or have low volatility compared to the $Ru_3(CO)_{12}$ precursor, but it was observed that when a carrier gas was flowed through the metal precursor vaporization chamber, a significant number of the metal particulate impurities were transferred to the process chamber along with the $Ru_3(CO)_{12}$ vapor, resulting in unacceptably high levels of accumulated metal particulate impurities on a substrate during processing in the process chamber. As is well known to those skilled in the art of manufacturing of integrated circuits, the presence of metal particulate impurities on the substrate can destroy devices formed from the substrate.

Embodiments of the invention provide a practical and efficient method and system for separating any metal-containing impurities from the as-received metal carbonyl precursor prior to processing a substrate in a deposition system. According to one embodiment of the invention, the metal carbonyl precursor can be solid ruthenium carbonyl precursor $Ru_3CO_{12}$. However, as those skilled in the art will appreciate, embodiments of the invention are not limited to the use of $Ru_3CO_{12}$, as other ruthenium carbonyl and metal carbonyl precursors may be used.

In the following description, in order to facilitate a thorough understanding of the invention and for purposes of explanation and not limitation, specific details are set forth, such as a particular geometry of the integrated system and descriptions of various components. However, it should be understood that the invention may be practiced in other embodiments that depart from these specific details.

Figure 1B:
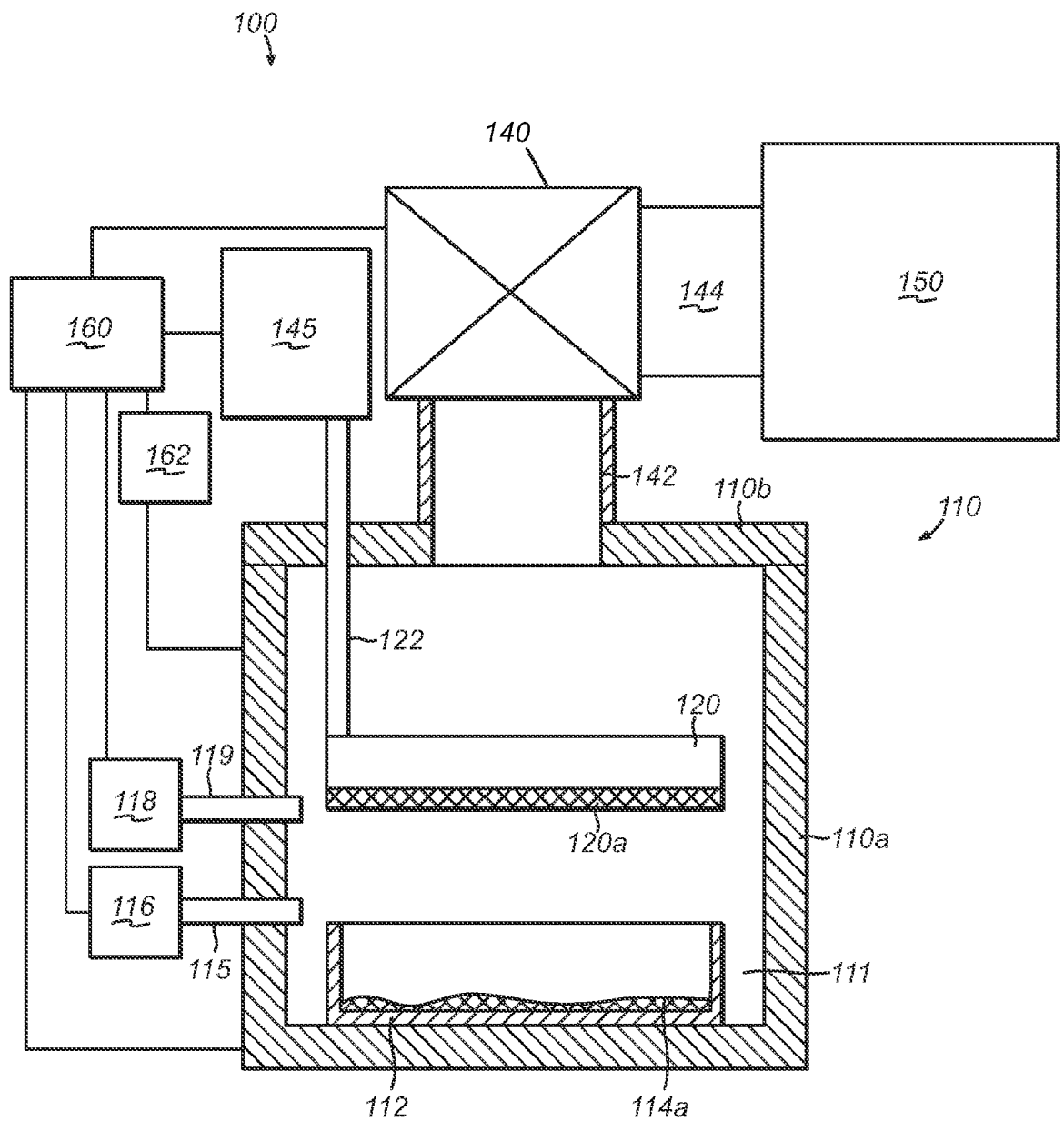

Referring now to the drawings, wherein like reference numerals designate identical or corresponding parts throughout the several views, FIGS. 1A-1B each depict a schematic view of an integrated system for purifying and delivering a metal carbonyl precursor according to an embodiment of the invention. In FIG. 1A, the integrated system 100 contains a metal precursor vaporization chamber 110 containing lower section 110a and upper section 110b. The lower section 110a is configured for accommodating in a lower portion 111 thereof a precursor tray 112 containing a metal carbonyl precursor 114. Alternately, the precursor tray 112 may be omitted and the metal carbonyl precursor 114 placed on the bottom of the lower section 110a without using the precursor tray 112. Thus, in accordance with the present invention, metal carbonyl precursor 114 may be positioned in any desired manner in the lower portion 111 of the vaporization chamber 110. According to one embodiment of the invention, the precursor tray 112 may contain an array of trays. The integrated system 100 is coupled to a deposition system 150 through precursor delivery lines 142 and 144 having a valve 140 therebetween, where the deposition system 150 is configured for depositing a metal or metal-containing layer on a substrate from a vapor of the metal carbonyl precursor.

In order to facilitate vaporization of the metal carbonyl precursor 114, the metal precursor vaporization chamber 110 is coupled to a chamber temperature control system 162 configured for controlling the temperature of the metal precursor vaporization chamber 110. The terms "vaporization", "sublimation" and "evaporation" are used interchangeably herein to refer to the general formation of a vapor (gas) from a solid precursor, regardless of whether the transformation is, for example, from solid to liquid to gas, or solid to gas.

Still referring to FIG. 1A, a vacuum pumping system 116 is configured for evacuating the metal precursor vaporization chamber 110 via evacuation line 115 to a pressure between about 0.1 mTorr and about 760 Torr. In one example, the pressure can be between about 10 mTorr and about 500 mTorr. A gas supply system 118 is configured to pressurize the metal precursor vaporization chamber 110 by flowing a carbon-monoxide-containing (CO-containing) gas into the metal precursor vaporization chamber 110 via gas feed line 119. The flow of the CO-containing gas can be controlled using a mass flow controller (MFC) (not shown) coupled to the gas feed line 119 between the gas supply system 118 and the metal precursor vaporization chamber 110. According to embodiments of the invention, the CO-containing gas contains CO and optionally a carrier gas that can contain an inert gas such as $N_2$ or a noble gas, for example argon (Ar). According to one embodiment of the invention, the CO-containing gas may be pure CO gas. Although not shown, it will be clear to those skilled in the art that the integrated system 100 schematically depicted in FIGS. 1A-1B can be configured with any number of valves, regulators, pressure gauges, and/or flow meters for measuring and controlling a flow of the CO-containing gas and monitoring the gas pressure in the metal precursor vaporization chamber 110.

A precursor collection plate 120 is mounted above and spaced from lower portion 111, and specifically from the precursor tray 112 when present, for condensing vapor of the vaporized un-reacted metal carbonyl precursor from the precursor tray 112. The precursor collection plate 120 is coupled to a vaporization/condensation temperature control system 145 via heating/cooling line 122 for controlling the temperature of the precursor collection plate 120. The vaporization/condensation temperature control system 145 can, for example, be capable of controlling the temperature of the precursor collection plate 120 between about 0° C. and about 150° C., or between about 20° C. and about 90° C. Exemplary precursor collection plate designs are described below in reference to FIGS. 3A-3C.

A control system 160 is configured to operate, and to control the operation of, the integrated system 100. The control system 160 includes a microprocessor, a memory, and a digital I/O port capable of generating control voltages sufficient to communicate with and activate inputs of the integrated system 100 as well as monitor outputs from the integrated system 100. Moreover, the control system 160 is coupled to and exchanges information with the metal precursor vaporization chamber 110, the vacuum pumping system 116, the gas supply system 118, the chamber temperature control system 162, the vaporization/condensation temperature control system 145, and the valve 140. A program stored in the memory is utilized to control the aforementioned components of integrated system 100 according to a stored process recipe. The control system 160 may be implemented as a general-purpose computer, digital signal process, etc.

The control system 160 may be locally located relative to the integrated system 100 or it may be remotely located relative to the integrated system 100 via the internet or an intranet. Thus, the control system 160 can exchange data with the integrated system 100 using at least one of a direct connection, an intranet, or the internet. The control system 160 may be coupled to an intranet at a customer site (i.e., a device maker, etc.), or coupled to an intranet at a vendor site (i.e., an equipment manufacturer). Furthermore, another computer (i.e., controller, server, etc.) can access the control system 160 to exchange data via at least one of a direct connection, an intranet, or the internet.

Metal precursor vaporization chambers utilized for providing $Ru_3(CO)_{12}$ vapor have contemplated operating within a temperature range of approximately 40° C. to 45° C. for $Ru_3(CO)_{12}$ precursor under vacuum conditions in order to prevent decomposition, which occurs at higher temperatures. For example, $Ru_3(CO)_{12}$ can decompose at elevated temperatures to form by-products, such as those illustrated below:

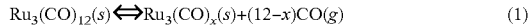

$$Ru_3(CO)_{12}(s) \Leftrightarrow Ru_3(CO)_x(s)+(12-x)CO(g) \quad (1)$$

or,

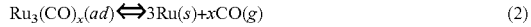

$$Ru_3(CO)_x(ad) \Leftrightarrow 3Ru(s)+xCO(g) \quad (2)$$

thereby forming a mixture of $Ru_3(CO)_{12}$, $Ru_3(CO)_x$, and possibly Ru metal in the metal precursor vaporization chamber. The low vapor pressure of $Ru_3(CO)_{12}$ and the small process window, can result in a very low deposition rate of a Ru layer on a substrate in a deposition system. In the above-mentioned co-pending applications, it was realized that a CO-containing gas may be used to reduce dissociation of the $Ru_3(CO)_{12}$ precursor, thereby allowing for heating the $Ru_3(CO)_{12}$ precursor to a high temperature (e.g., 80° C., or higher), which increases the vapor pressure of the $Ru_3(CO)_{12}$ precursor without significant decomposition of the $Ru_3(CO)_{12}$ precursor vapor during vaporization.

In embodiments of the current invention, a CO-containing gas is utilized to effectively vaporize and separate un-reacted $Ru_3(CO)_{12}$ from Ru-containing and non-Ru-containing impurities in the metal precursor vaporization chamber 110. Further, the use of a CO-containing gas reduces dissociation of the $Ru_3(CO)_{12}$ precursor, thereby shifting the equilibrium in Equation (1) to the left and reducing premature decomposition of the $Ru_3(CO)_{12}$ precursor while allowing for heating the $Ru_3(CO)_{12}$ precursor to higher temperature in the metal precursor vaporization chamber 110 than is possible without a CO-containing gas. It is believed that addition of the CO gas to the $Ru_3(CO)_{12}$ precursor vapor allows for increasing the vaporization temperature from approximately 40° C. to approximately 150° C., or higher. The elevated temperature increases the vapor pressure of the $Ru_3(CO)_{12}$ precursor, resulting in increased vaporization of the $Ru_3(CO)_{12}$ precursor 114 from the precursor tray 112.

As depicted in FIG. 1B, the vaporized metal carbonyl precursor may be condensed as a purified metal carbonyl precursor 120a on the precursor collection plate 120, which is kept at lower temperature than the precursor tray 112 and the walls of the metal precursor vaporization chamber 110. To state another way, the precursor collection plate 120 is maintained at a condensation temperature that is less than the temperature used to vaporize the metal carbonyl precursor, i.e., vaporization temperature. When the transfer of the un-reacted metal carbonyl precursor from the precursor tray 112 to the precursor collection plate 120 is complete, a metal-containing impurity layer 114a containing partially reacted metal carbonyl precursor and any metal particulate impurities remains on the precursor tray 112. After the purifying process, the purified metal carbonyl precursor 120a may be vaporized by increasing the temperature of the precursor collection plate 120 from the condensation temperature to a vaporization temperature, and the vapor is then delivered to the deposition system 150 to be utilized for depositing a metal or metal-containing layer on a substrate in the deposition system 150. When the purified metal carbonyl precursor 120a has been spent, the substrate processing may be stopped and the precursor tray 112 removed from metal precursor vaporization chamber 110 for cleaning and a new batch of metal carbonyl precursor provided in the metal precursor vaporization chamber 110.

Figure 2:
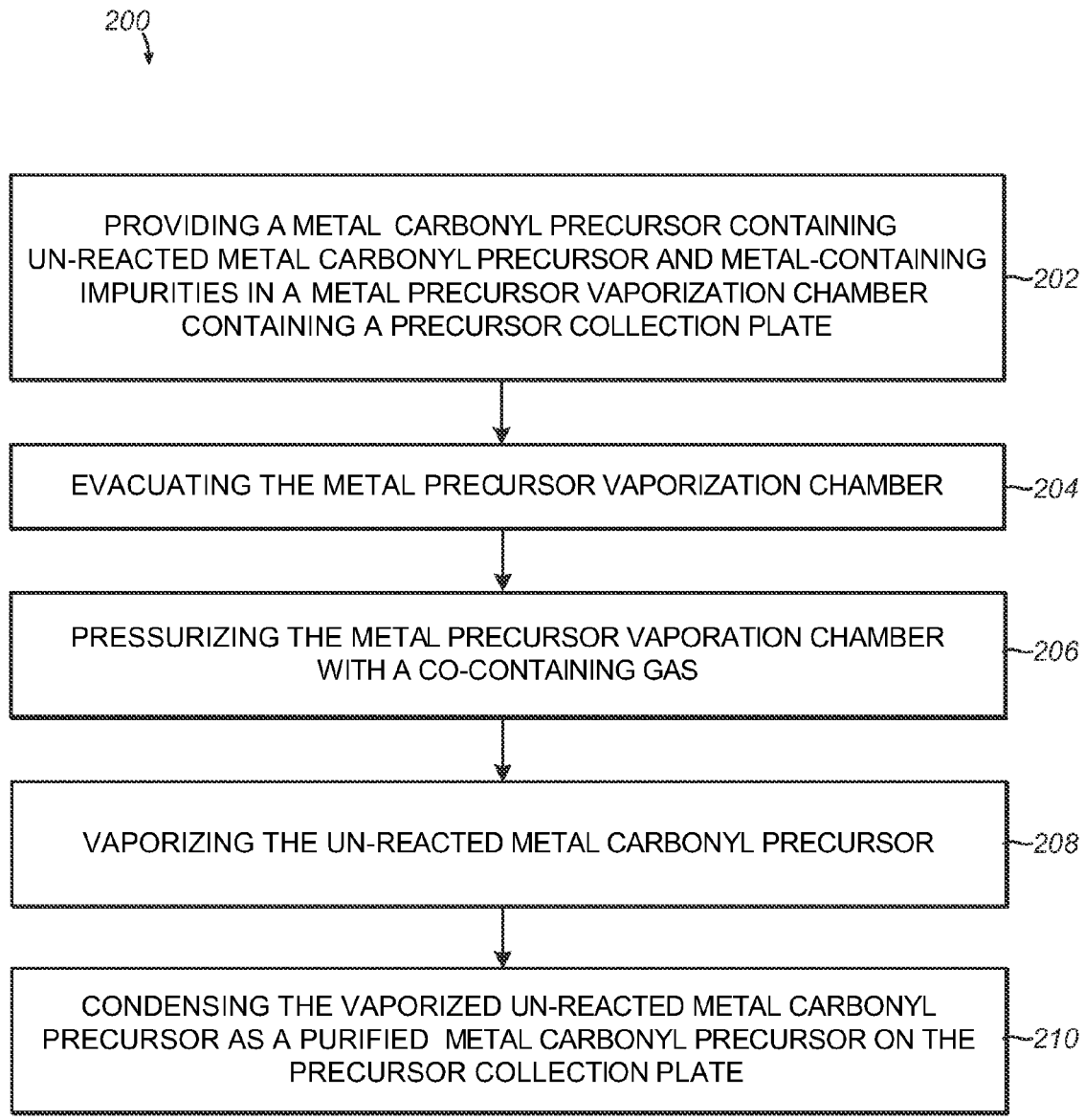
FIG. 2 is flowchart illustrating a method of purifying a metal carbonyl precursor according to an embodiment of the invention.

FIG. 2 is flowchart illustrating a method of purifying a metal carbonyl precursor according to an embodiment of the invention. Referring now to FIG. 2 and FIGS. 1A-1B, the process 200 includes, in step 202, providing a metal carbonyl precursor 114 containing un-reacted metal carbonyl precursor and metal-containing impurities in a metal precursor vaporization chamber 110 containing a precursor collection plate 120 such that the metal carbonyl precursor 114 is spaced from the precursor collection plate 120. The metal carbonyl precursor 114 may be provided in the lower portion 111 of the metal precursor vaporization chamber 110 utilizing a precursor tray 112 that may be positioned inside metal precursor vaporization chamber 110 by removing the upper part 110b from the lower part 110a. In step 202, the metal precursor vaporization chamber 110, the precursor tray 112, and the precursor collection plate 120 may each be maintained at room temperature.

In step 204, the metal precursor vaporization chamber 110 is evacuated through the evacuation line 115 by the vacuum pumping system 116. The metal precursor vaporization chamber 110 may be evacuated to a pressure between about 0.1 mTorr and about 760 Torr. In one example, the pressure can be between about 10 mTorr and about 500 mTorr.

In step 206, the metal precursor vaporization chamber 110 is pressurized with a CO-containing gas that is flowed from the gas supply system 118 through the gas line 119 into the metal precursor vaporization chamber 110 until a predetermined gas pressure is obtained in the metal precursor vaporization chamber 110. The gas pressure can, for example, be between about 10 mTorr and about 760 Torr, or higher.

In step 208, the un-reacted metal carbonyl precursor is vaporized by heating the metal carbonyl precursor 114 to a predetermined vaporization temperature that enables vaporization of the metal carbonyl precursor 114. According to one embodiment of the invention, a ruthenium carbonyl precursor may be heated to a temperature between about 40° C. and about 150° C., or a temperature between about 80° C. and about 90° C. In general, higher gas pressure in the metal precursor vaporization chamber 110 results in a lower precursor vaporization rate and lower precursor decomposition.

In step 210, and as depicted in FIG. 1B, the vaporized un-reacted metal carbonyl precursor is condensed as a purified metal carbonyl precursor 120a on the precursor collection plate 120. The precursor collection plate 120 is maintained at a condensation temperature that is lower than the vaporization temperature for the metal carbonyl precursor 114 and lower than the temperature of the walls of the metal precursor vaporization chamber 110. The condensation temperature is maintained by the vaporization/condensation temperature control system 145 in order to adsorb and condense the purified metal carbonyl precursor 120a onto surfaces of the precursor collection plate 120. In one example, the temperature of the precursor collection plate 120 can be maintained at a temperature that is at least about 20° C. lower than the vaporization temperature of the metal carbonyl precursor 114. In another example, the temperature of the precursor collection plate 120 can be maintained between about 0° C. and about 40° C., for example about 15° C. At least a portion of the partially reacted metal carbonyl precursor and metal particulate impurities remain as impurity layer 114a on precursor tray 112.

As would be appreciated by those skilled in the art, each of the steps or stages in the flowchart of FIG. 2 may encompass one or more separate steps and/or operations. Accordingly, the recitation of only five steps in 202, 204, 206, 208, and 210 should not be understood to limit the method of the present invention solely to five steps or stages. Moreover, each representative step or stage 202, 204, 206, 208, 210 should not be understood to be limited to only a single process.

Following condensation of the purified metal carbonyl precursor 120a on the precursor collection plate 120, the purified metal carbonyl precursor 120a may be used to process a substrate in the deposition system 150. In particular, the precursor collection plate 120 may be heated from the condensation temperature to a vaporization temperature to vaporize the purified metal carbonyl precursor 120a and a process gas containing the vapor of the purified metal carbonyl precursor may be delivered by flowing a carrier gas containing CO through the metal precursor vaporization chamber 110 to the deposition system 150 to process a substrate. According to one embodiment of the invention, the carrier gas contains CO and optionally an inert gas such as $N_2$ or a noble gas, for example argon (Ar). According to one embodiment of the invention, pure CO gas may be used. In one example, the precursor vaporization chamber 110 and the precursor collection plate 120 may be maintained at the same temperature. In the exemplary case of $Ru_3(CO)_{12}$, a temperature between about 80° C. and about 90° C. may be used.

Figure 3A:
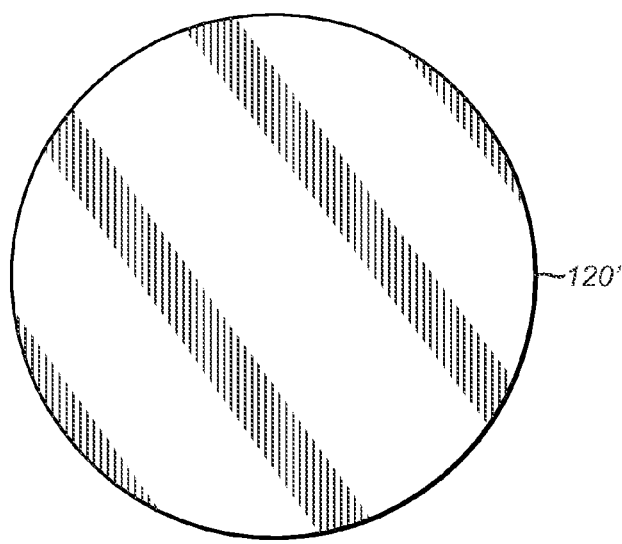
FIGS. 3A-3C schematically depict precursor collection plate designs that may be utilized in an integrated system for purifying and delivering a metal carbonyl precursor according to embodiments of the invention.
Figure 3B:
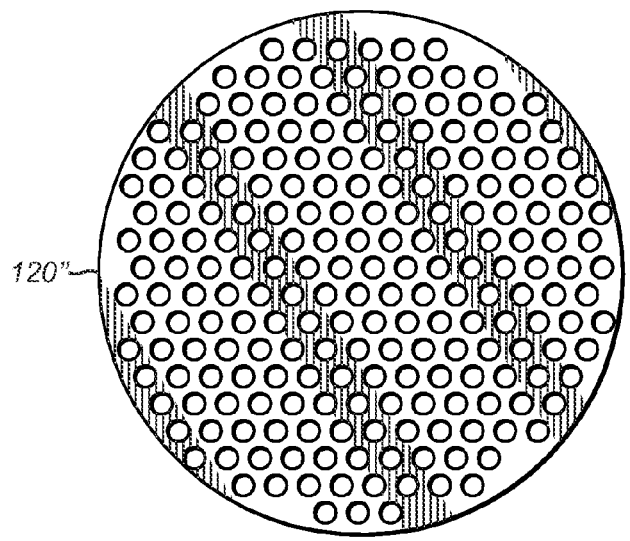
Figure 3C:
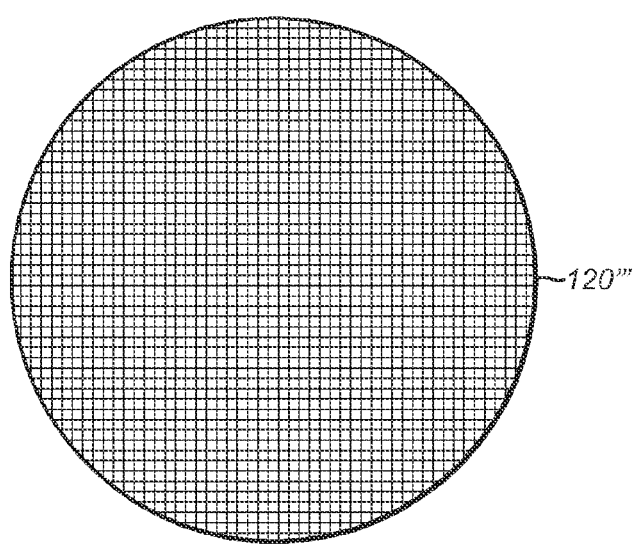

FIGS. 3A-3C schematically depict precursor collection plate designs that may be utilized in an integrated system for purifying and delivering a metal carbonyl precursor according to embodiments of the invention. FIG. 3A schematically depicts a precursor collection plate 120' having a smooth surface with a relatively low surface area. FIG. 3B schematically depicts a precursor collection plate 120" having a "honeycomb" structure with a large surface area for accommodating large amounts of purified metal carbonyl precursor. FIG. 3C schematically depicts a precursor collection plate 120'" having a "mesh" structure with a very large surface area for accommodating very large amounts of the purified metal carbonyl precursor. The precursor collection plate design selected can depend on the type of metal carbonyl precursor used and the amount of purified metal carbonyl precursor collected.

Figure 4A:
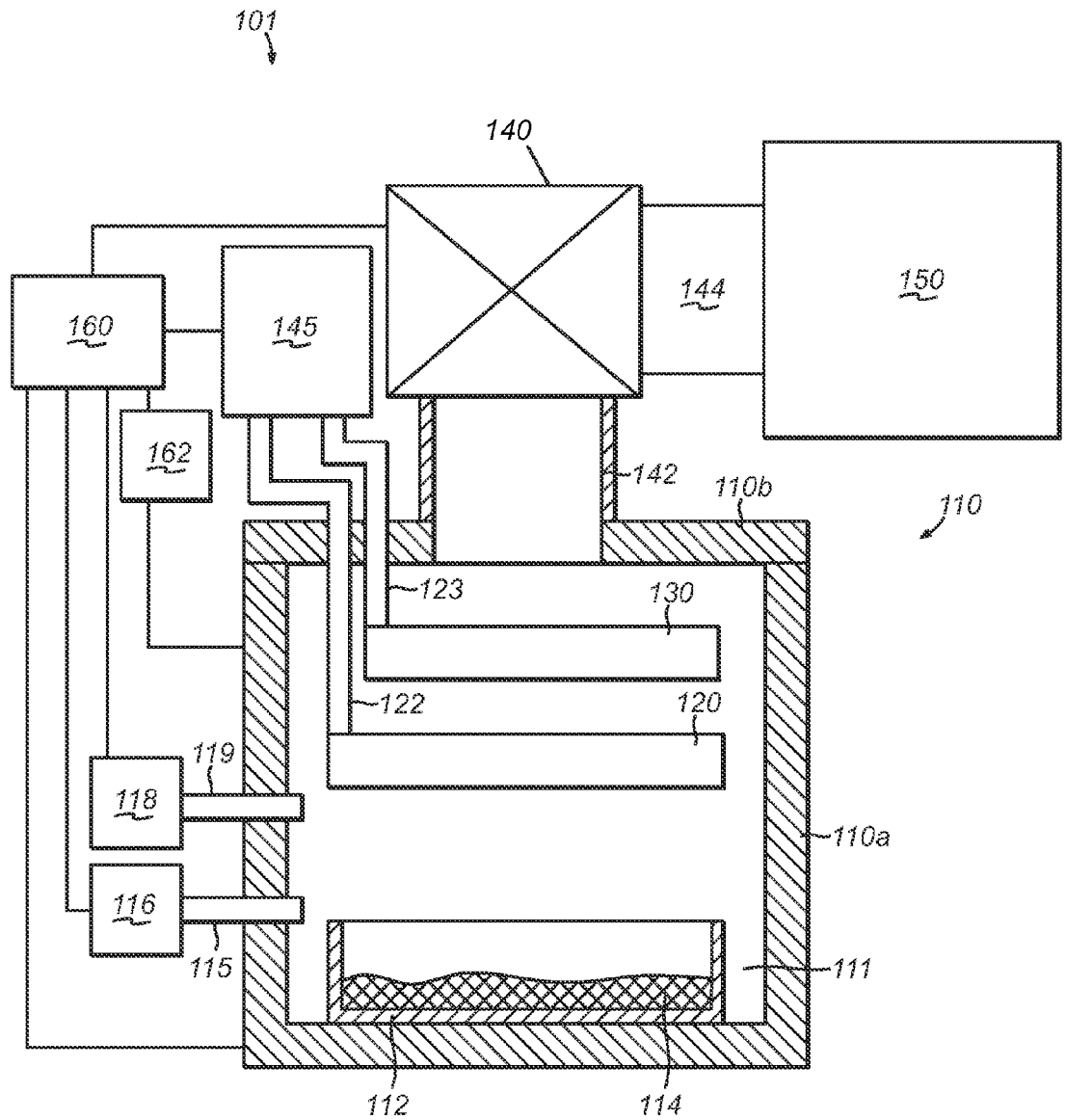
FIGS. 4A-4C each depict a schematic view of an integrated system for purifying and delivering a metal carbonyl precursor according to another embodiment of the invention.
Figure 4B:
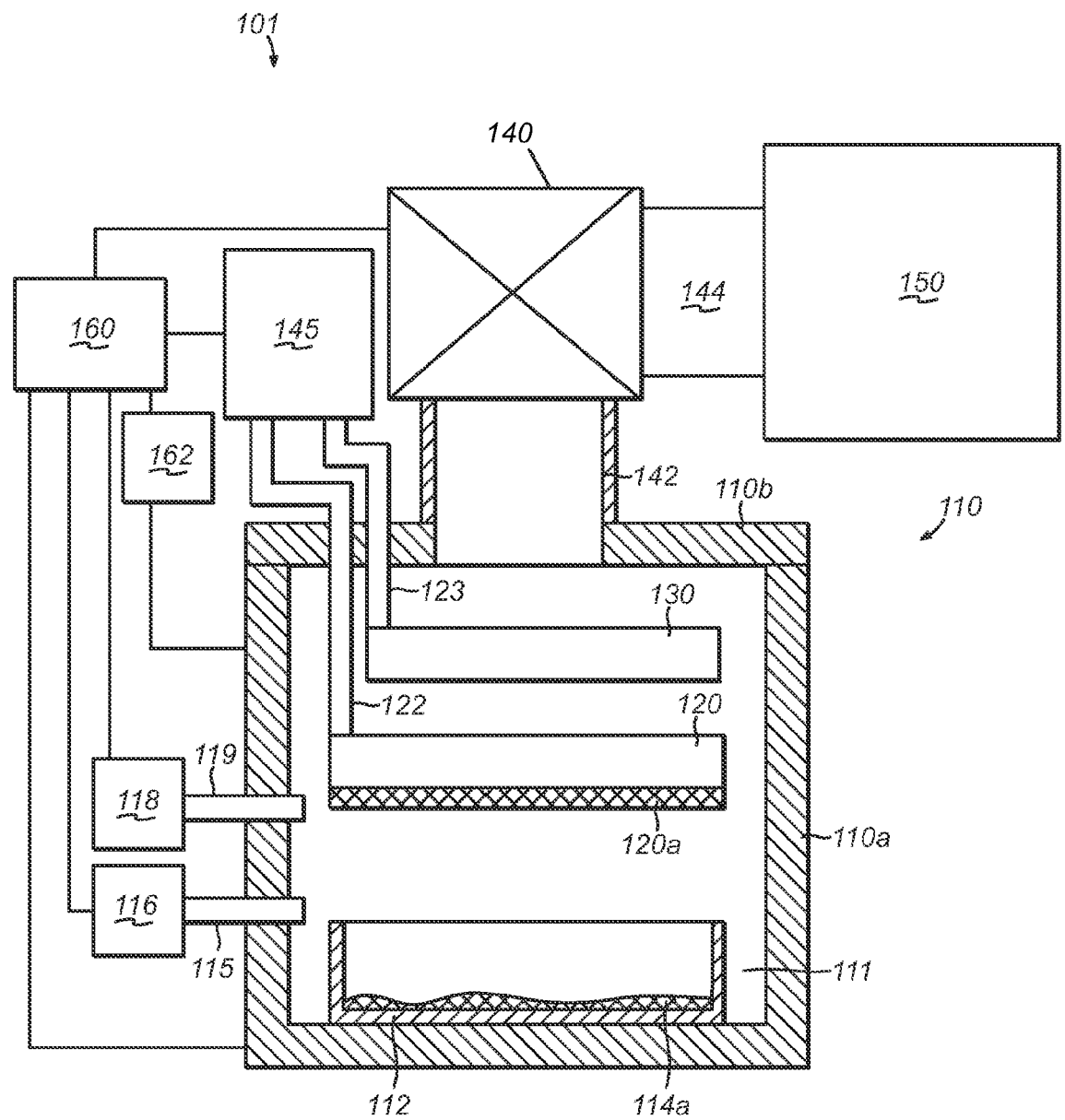
Figure 4C:
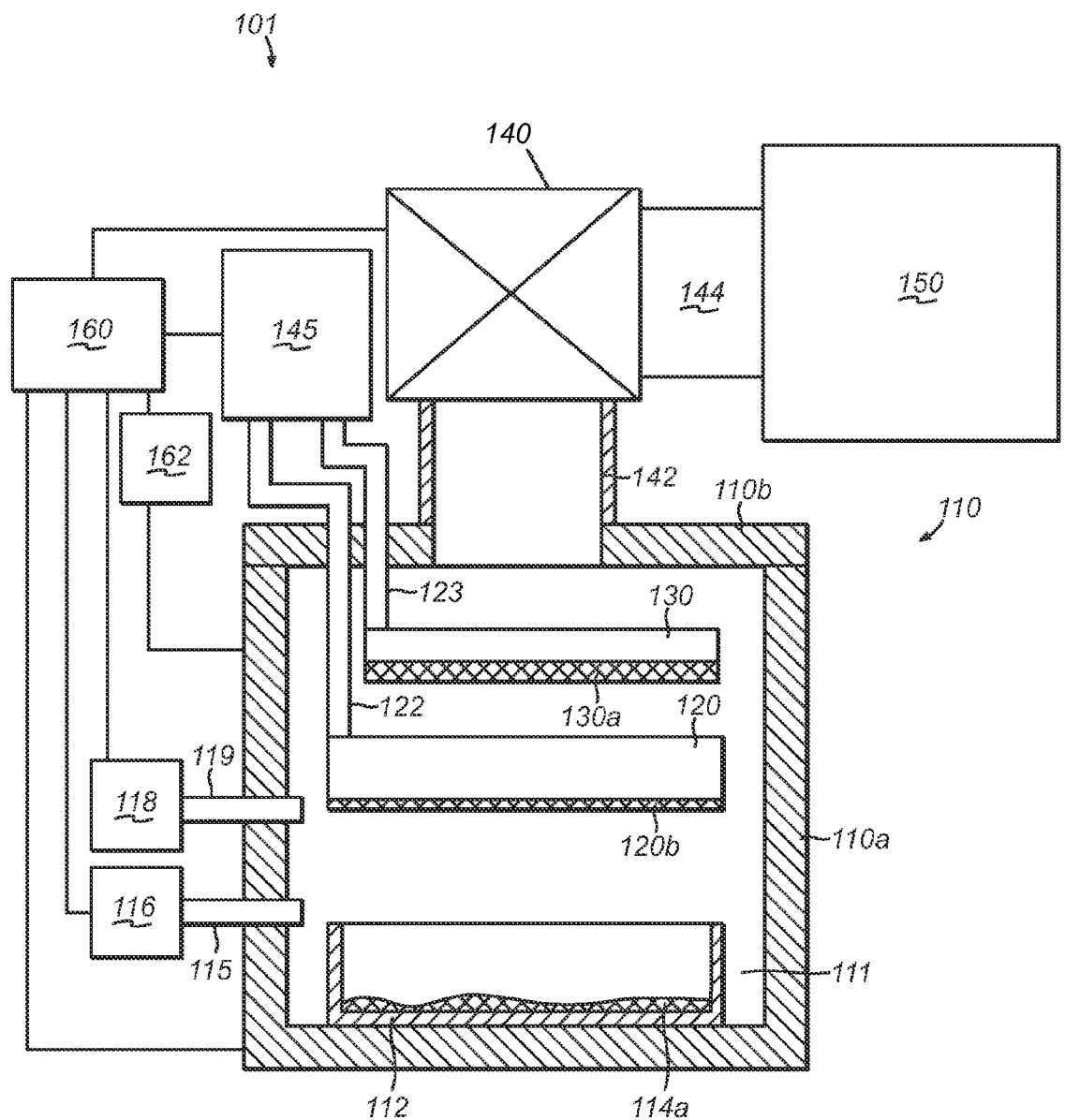

FIGS. 4A-4C each depict a schematic view of an integrated system for purifying and delivering a metal carbonyl precursor according to another embodiment of the invention. The integrated system 101 depicted in FIGS. 4A-4C is similar to the integrated system 100 depicted in FIGS. 1A-1B. The integrated system 101 contains a first precursor collection plate 120 for purifying a metal carbonyl precursor and a second precursor collection plate 130 mounted above and spaced from the first precursor collection plate 120 for condensing a further purified metal carbonyl precursor. The in-situ purifying system 101 further contains a vaporization/condensation temperature control system 145 for controlling the temperature of the first and second precursor collection plates 120, 130 through heating/cooling lines 122, 123.

Figure 5:
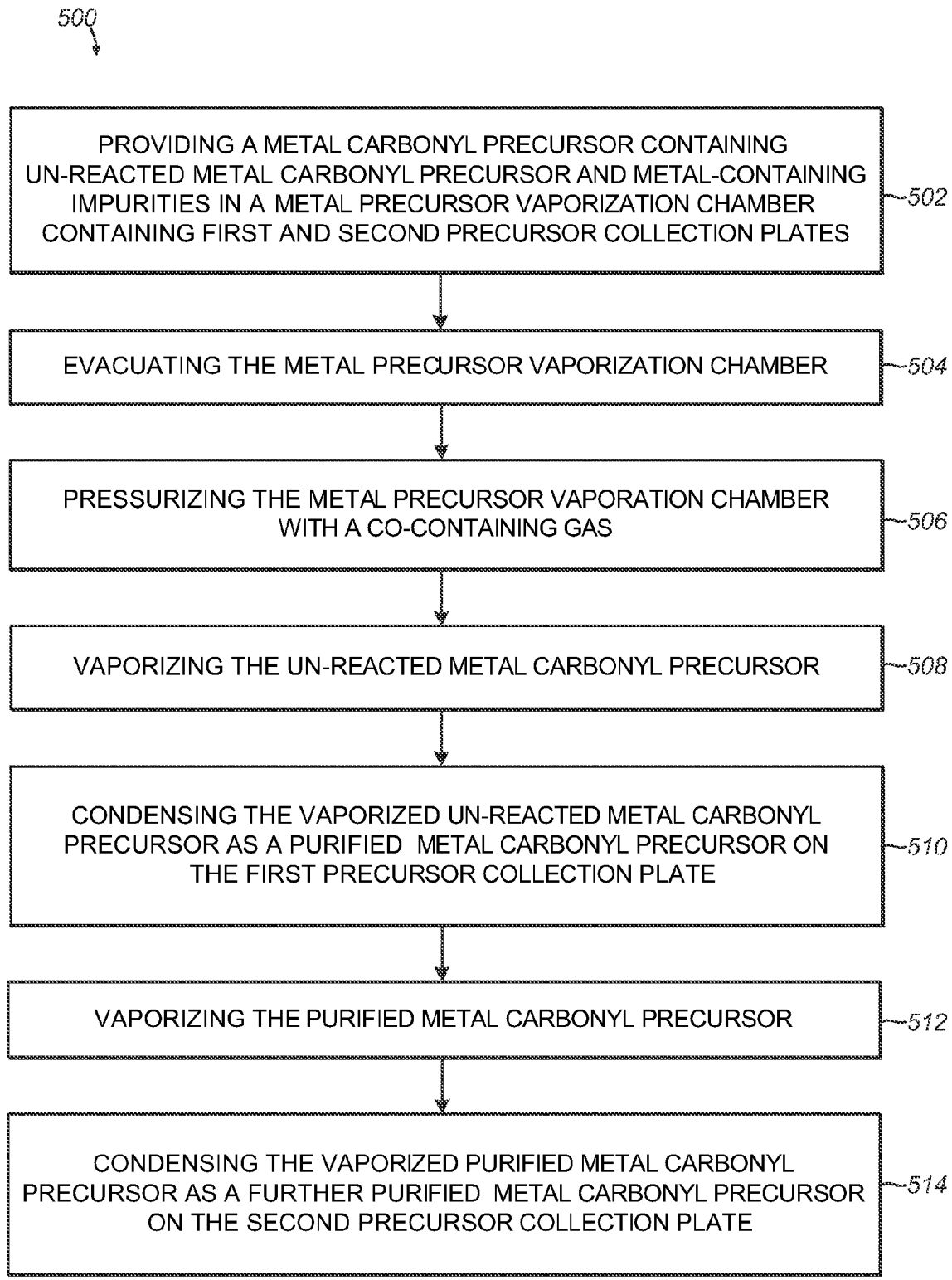
FIG. 5 is flowchart illustrating a method of purifying a metal carbonyl precursor according to another embodiment of the invention.

FIG. 5 is flowchart illustrating a method of purifying a metal carbonyl precursor according to another embodiment of the invention. In FIG. 5, steps 502-510 of process 500 are similar to steps 202-210 of process 200 in FIG. 2. Referring now to FIGS. 4A-4C and FIG. 5, in step 502, a metal carbonyl precursor 114 containing un-reacted metal carbonyl precursor and metal-containing impurities is provided in the metal precursor vaporization chamber 110 containing a first precursor collection plate 120 and a second precursor collection plate 130 such that the metal carbonyl precursor 114 is spaced from the first and second precursor collection plates 120, 130 and the second collection plate 130 is spaced from the first precursor collection plate 120. In step 202, the metal precursor vaporization chamber 110, the precursor tray 112, and the precursor collection plates 120, 130 may each be maintained at room temperature.

In step 504, the metal precursor vaporization chamber 110 is evacuated through the evacuation line 115 by the vacuum pumping system 116.

In step 506, the metal precursor vaporization chamber 110 is pressurized with a CO-containing gas that is flowed from the gas supply system 118 through the gas line 119 into the metal precursor vaporization chamber 110 until a predetermined gas pressure is obtained in the metal precursor vaporization chamber 110.

In step 508, the un-reacted metal carbonyl precursor is vaporized by heating the metal carbonyl precursor 114 to a predetermined vaporization temperature that enables vaporization of the metal carbonyl precursor 114. According to one embodiment of the invention, a ruthenium carbonyl precursor may be heated to a temperature between about 40° C. and about 150° C., or a temperature between about 80° C. and about 90° C.

In step 510, and as depicted in FIG. 4B, the vaporized un-reacted metal carbonyl precursor is condensed as a purified metal carbonyl precursor 120a on the first precursor collection plate 120. The first precursor collection plate 120 is maintained at a condensation temperature that is lower than the vaporization temperature for the metal carbonyl precursor 114. The condensation temperature is maintained by the vaporization/condensation temperature control system 145 in order to adsorb and condense the purified metal carbonyl precursor 120a onto the surfaces of the first precursor collection plate 120. In one example, the condensation temperature of the first precursor collection plate 120 can be maintained at a temperature that is at least about 20° C. lower than the vaporization temperature of the metal carbonyl precursor 114. In another example, the temperature of the first precursor collection plate 120 can be maintained between about 0° C. and about 40° C., for example about 15° C. In step 510, the temperature of the metal carbonyl precursor 114, the second precursor collection plate 130, and the walls of the metal precursor vaporization chamber 110, may be maintained at the vaporization temperature, for example, at a temperature between about 40° C. and about 150° C., or at a temperature between about 80° C. and about 90° C. At least a portion of the partially reacted metal carbonyl precursor and metal particulate impurities remain as impurity layer 114a on precursor tray 112.

Next, in step 512, the purified metal carbonyl precursor 120a is vaporized by heating the first precursor collection plate 120 from the condensation temperature to a predetermined vaporization temperature that enables vaporization. The vaporization temperature for the purified metal carbonyl precursor 120a may be the same or different than the vaporization temperature used for the metal carbonyl precursor 114. According to one embodiment of the invention, the first precursor collection plate 120 may be heated to a temperature between about 40° C. and about 150° C., or a temperature between about 80° C. and about 90° C.

In step 514, and as depicted in FIG. 4C, the vaporized purified metal carbonyl precursor is condensed as a further purified metal carbonyl precursor 130a on the second precursor collection plate 130. The second precursor collection plate 130 is maintained at a condensation temperature that is lower than the vaporization temperature to which the first precursor collection plate 120 is heated, for example at least about 20° C. lower. The respective temperatures of the first and second precursor collection plates 120 and 130 are separately adjustable and are maintained by the vaporization/condensation temperature control system 145 in order to adsorb and condense the further purified metal precursor 130a onto the surfaces of the second precursor collection plate 130. In one example, the condensation temperature of the second precursor collection plate 130 can be maintained between about 0° C. and about 40° C., for example 15° C., by the vaporization/condensation temperature control system 145. When the vaporization of the purified metal carbonyl precursor 120a from the first precursor collection plate 120 to the second precursor collection plate 130 is complete, a metal-containing impurity 120b may remain on the first precursor collection plate 120.

Following formation of the further purified metal carbonyl precursor 130a on the precursor collection plate 130, the further purified metal carbonyl precursor 130a may be used to process a substrate in the processing system 150. In particular, the precursor collection plate 130 may be heated to vaporize the further purified metal carbonyl precursor 130a and a process gas containing the vapor of the further purified metal carbonyl precursor may be delivered by flowing a carrier gas containing CO through the metal precursor vaporization chamber 110 to the deposition system 150 to process a substrate. According to one embodiment of the invention, the carrier gas contains CO and optionally an inert gas such as $N_2$ or a noble gas, for example argon (Ar). According to one embodiment of the invention, pure CO gas may be used. In one example, the precursor vaporization chamber 110, and the first and second precursor collection plates 120, 130 may be maintained at the same temperature. In the exemplary case of $Ru_3(CO)_{12}$, a temperature between about 80° C. and about 90° C. may be used.

Figure 6A:
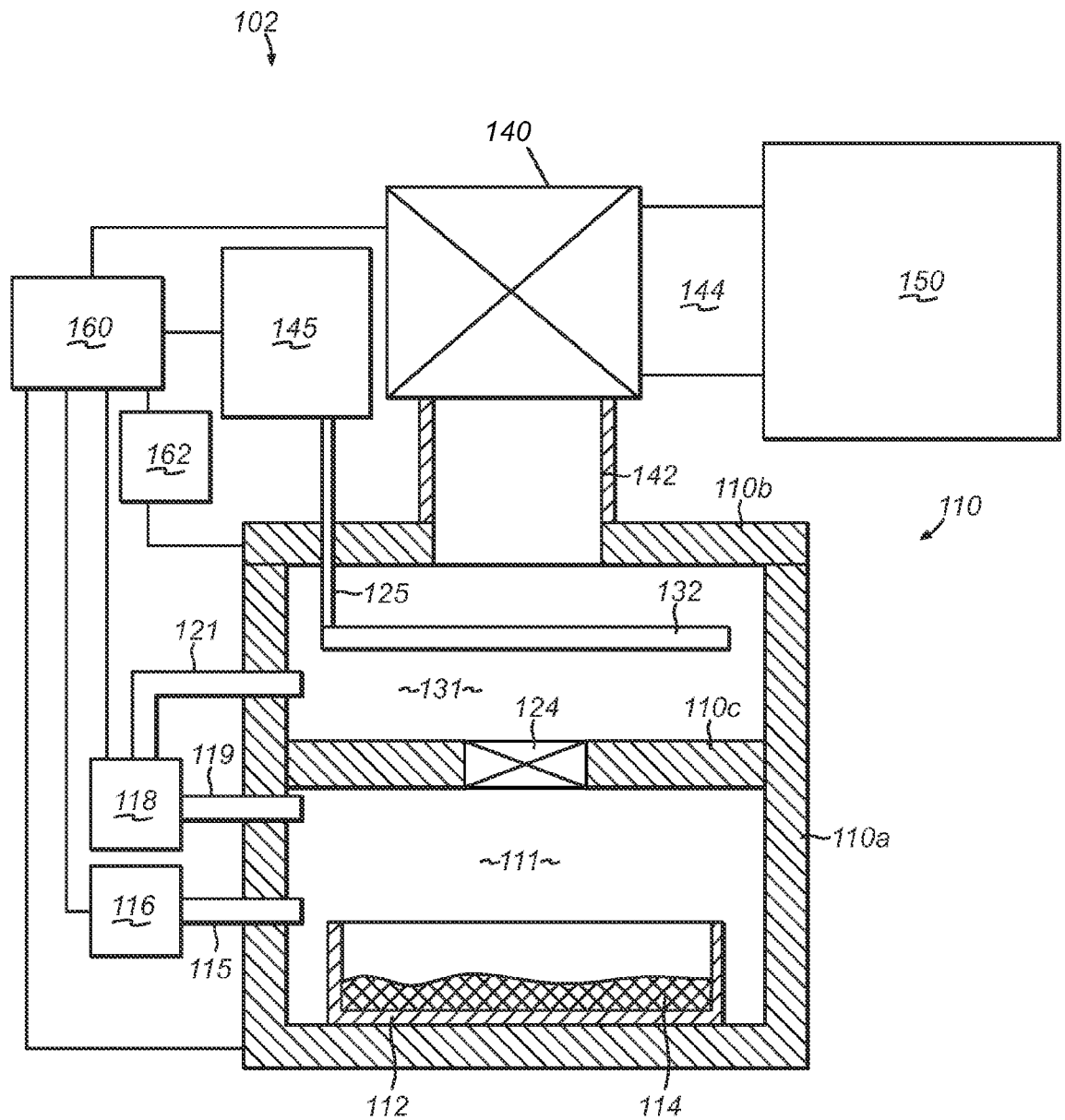
FIGS. 6A-6B each depict a schematic view of an integrated system for purifying and delivering a metal carbonyl precursor according to yet another embodiment of the invention.
Figure 6B:
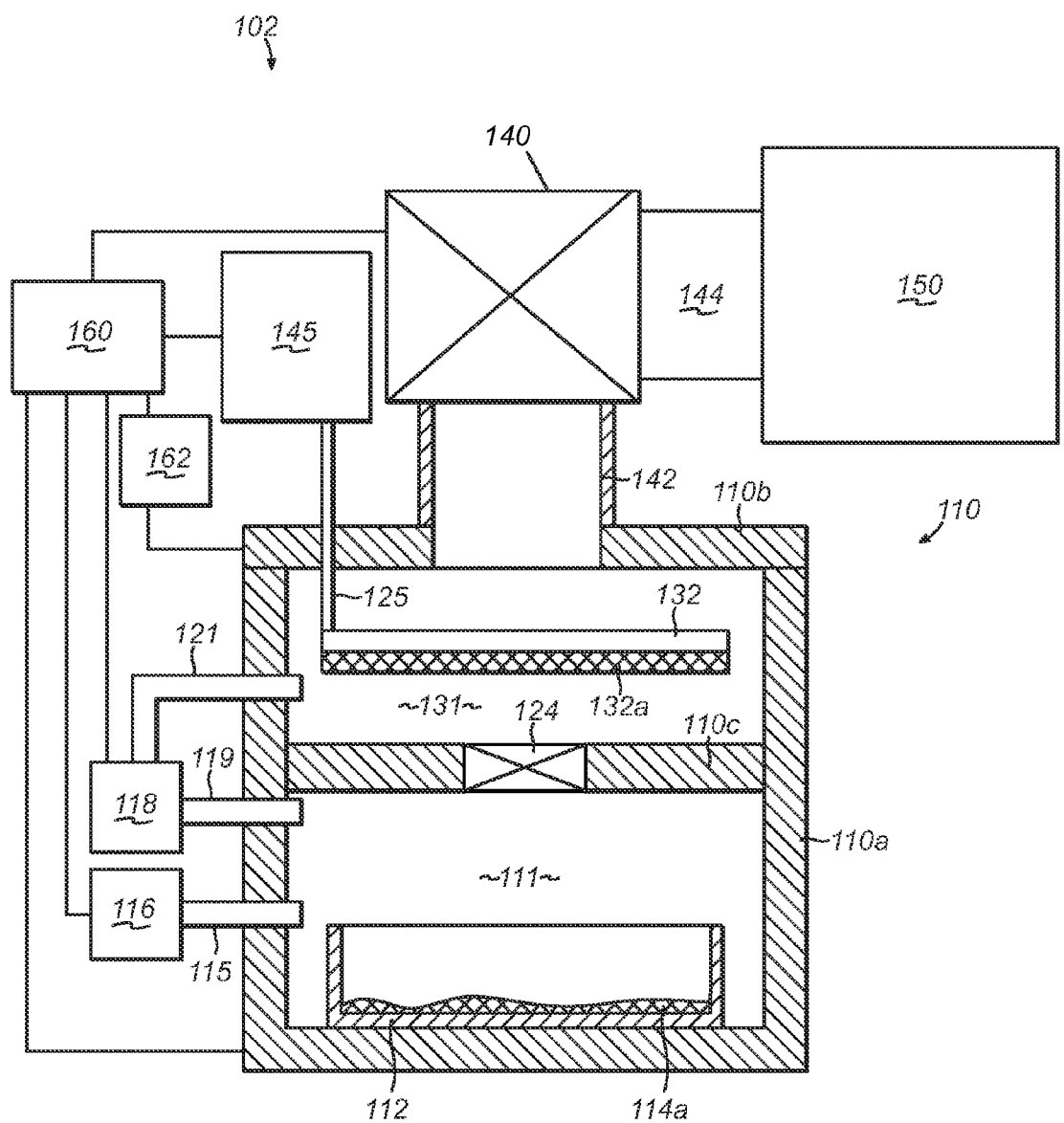

FIGS. 6A-6B each depict a schematic view of an integrated system for purifying and delivering a metal carbonyl precursor according to yet another embodiment of the invention. The integrated system 102 depicted in FIGS. 6A-6B is similar to the integrated systems 100, 101 depicted in FIGS. 1A-1B and FIGS. 4A-4C. The integrated system 102 contains a precursor collection plate 132 for purifying a metal carbonyl precursor. Although only one precursor collection plate 132 is depicted in FIGS. 6A-6B, any number and designs of precursor collection plates may be utilized without departing from the scope of the invention. The integrated system 102 contains a vaporization/condensation temperature control system 145 for controlling the temperature of the precursor collection plate 132 through heating/cooling line 125. In the embodiment depicted in FIG. 6A, lower portion 111 of metal precursor vaporization chamber 110, which contains the metal carbonyl precursor 114 in precursor tray 112, is physically separated from an upper portion 131 of metal precursor vaporization chamber 110, which contains the precursor collection plate 132, by an intermediate partition 110c. Further, the precursor collection plate 132 is pneumatically coupled to the precursor tray 112 by a valve 124 in intermediate partition 110c that allows for passing vaporized un-reacted metal carbonyl precursor through partition 110c during the purifying process and for isolating the impurity layer 114a in precursor tray 112 from the purified metal carbonyl precursor 132a following the purifying process.

As described above, and with valve 124 in an open position, un-reacted metal carbonyl precursor is vaporized by heating the metal carbonyl precursor 114 to a predetermined vaporization temperature that enables vaporization of the metal carbonyl precursor 114, and the vaporized un-reacted metal carbonyl precursor is condensed as a purified metal carbonyl precursor 132a on the precursor collection plate 132, as depicted in FIG. 6B. The precursor collection plate 132 is maintained at a condensation temperature that is lower than the vaporization temperature of metal carbonyl precursor 114 and lower than the temperature of the walls of the metal precursor vaporization chamber 110, for example at least about 20° C. lower. The condensation temperature is maintained by the vaporization/condensation temperature control system 145 in order to adsorb and condense the purified metal carbonyl precursor 132a.

After the purifying process, valve 124 is switched to a closed position, and the precursor collection plate 132 may be heated from the condensation temperature to a vaporization temperature to vaporize the purified metal carbonyl precursor 132a. A process gas containing the vapor of the purified metal carbonyl precursor 132a formed by flowing a carrier gas containing CO from gas supply system 118 into the metal precursor vaporization chamber 110 using the gas feed line 121, and the process gas is delivered to the deposition system 150 to process a substrate.

In each of the embodiments shown and described, the metal precursor vaporization chamber 110 is depicted to receive the precursor 114 in the lower portion 111, and the precursor collection plates 120, 130, 132 are positioned above the lower portion 111. It may be appreciated, however, that alternative orientations of the chamber 110, precursor 114, and plates 120, 130, 132 are contemplated. For example, a precursor tray 112 may be mounted in an upper portion 131 of the chamber 110 and the precursor collection plate(s) 120, 130, 132 may be positioned below the precursor 114. In another example, the precursor collection plate(s) 120, 130, 132 may be positioned in side-by-side relation to the precursor 114. Thus, in accordance with the present invention, the precursor collection plate(s) need only be spaced from the precursor 114, in any manner, so as to enable partially reacted precursor and metal impurities 114a to remain in one position and the purified precursor 120a or 132a to condense in another position within the chamber 110. Similarly, precursor collection plate 130 need only be spaced from precursor collection plate 120, in any manner, so as to enable partially reacted precursor and metal impurities 120b to remain in one position and the further purified precursor 130a to condense in another position within the chamber 110. Further, the delivery line 142 need not be coupled at the top of the chamber 110, but rather, may be coupled at any desired location.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of purifying a metal carbonyl precursor comprising un-reacted metal carbonyl precursor and metal-containing impurities, the method comprising:

providing the metal carbonyl precursor in a metal precursor vaporization chamber comprising a precursor collection plate such that the metal carbonyl precursor is spaced from the precursor collection plate;

evacuating the metal precursor vaporization chamber;
pressurizing the metal precursor vaporization chamber with a CO-containing gas;
vaporizing the un-reacted metal carbonyl precursor; and
condensing the vaporized un-reacted metal carbonyl precursor as a purified metal carbonyl precursor on the precursor collection plate, whereby at least a portion of the metal-containing impurities remain spaced from the precursor collection plate.

2. The method according to claim 1, wherein the metal carbonyl precursor comprises $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

3. The method according to claim 1, wherein the pressurizing comprises flowing CO gas and optionally an inert gas into the metal precursor vaporization chamber and maintaining a gas pressure between about 10 mTorr and about 760 Torr in the metal precursor vaporization chamber.

4. The method according to claim 1, wherein the vaporizing comprises heating the metal carbonyl precursor to a temperature between about 40° C. and about 150° C.

5. The method according to claim 4, wherein the precursor collection plate is maintained at a temperature between about 0° C. and about 40° C.

6. The method according to claim 1, wherein the precursor collection plate is maintained at a temperature less than a heating temperature for vaporizing the un-reacted metal carbonyl precursor.

7. The method according to claim 6, wherein the precursor collection plate is maintained at a temperature at least about 20° C. less than the heating temperature for vaporizing.

8. The method according to claim 1, further comprising:
vaporizing the purified metal carbonyl precursor; and
forming a process gas containing the vapor of the purified metal carbonyl precursor by flowing a gas containing CO through the metal precursor vaporization chamber to a deposition system configured to expose a substrate to the process gas.

9. The method of claim 1, further comprising:
vaporizing the purified metal carbonyl precursor; and
condensing the vaporized purified metal carbonyl precursor as a further purified metal carbonyl precursor on a second precursor collection plate spaced from the precursor collection plate.

10. The method according to claim 9, wherein the second precursor collection plate is maintained at a temperature less than a heating temperature for vaporizing the purified metal carbonyl precursor.

11. A method of purifying a metal carbonyl precursor comprising un-reacted metal carbonyl precursor and metal-containing impurities, the method comprising:
providing the metal carbonyl precursor in a metal precursor vaporization chamber comprising independent temperature adjustable first and second precursor collection plates such that the metal carbonyl precursor is spaced from the first and second precursor collection plates and the second precursor collection plate is spaced from the first precursor collection plate;
evacuating the metal precursor vaporization chamber;
pressurizing the metal precursor vaporization chamber with a CO-containing gas;
heating the metal carbonyl precursor to a first vaporization temperature to vaporize the un-reacted metal carbonyl precursor;
condensing the vaporized un-reacted metal carbonyl precursor as a purified metal carbonyl precursor on the first precursor collection plate maintained at a first condensation temperature that is less than the first vaporization temperature;
adjusting the temperature of the first precursor collection plate from the first condensation temperature to a second vaporization temperature to vaporize the purified metal carbonyl precursor; and
condensing the vaporized purified metal carbonyl precursor as a further purified metal carbonyl precursor on the second precursor collection plate maintained at a second condensation temperature that is less than the second vaporization temperature.

12. The method according to claim 11, wherein the metal carbonyl precursor comprises $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

13. The method according to claim 11, wherein the pressurizing comprises flowing CO gas and optionally an inert gas into the metal precursor vaporization chamber and maintaining a gas pressure between 10 mTorr and about 760 Torr in the metal precursor vaporization chamber.

14. The method according to claim 11, wherein the first vaporization temperature is between about 40° C. and about 150° C., and the heating includes heating the second precursor collection plate to the first vaporization temperature.

15. The method according to claim 14, wherein the first condensation temperature is between about 0° C. and about 40° C.

16. The method according to claim 11, wherein the second vaporization temperature is between about 40° C. and about 150° C.

17. The method according to claim 16, wherein the second condensation temperature is between about 0° C. and about 40° C.

18. The method according to claim 11, wherein the first condensation temperature is at least 20° C. less than the first vaporization temperature, and the second condensation temperature is at least 20° C. less than the second vaporization temperature.

19. The method according to claim 11, further comprising:
vaporizing the further purified metal carbonyl precursor; and
forming a process gas containing the vapor of the purified metal carbonyl precursor by flowing a gas containing CO through the metal precursor vaporization chamber to a deposition system configured to expose a substrate to the process gas.

20. An integrated system for purifying and delivering a metal carbonyl precursor, comprising:
a metal precursor vaporization chamber comprising:
a vacuum pumping system configured for evacuating the precursor vaporization chamber,
a gas supply system configured for pressurizing the precursor vaporization chamber with a CO-containing gas,
means for vaporizing the metal carbonyl precursor in the metal precursor vaporization chamber, and
at least one precursor collection plate configured for condensing and vaporizing a purified metal carbonyl precursor;
a deposition system in fluid communication with the metal precursor vaporization chamber; and
a controller configured for controlling the integrated system.

21. The integrated system of claim 20 wherein the at least one precursor collection plate includes a first precursor collection plate spaced from a portion of the metal precursor vaporization chamber configured to receive the metal carbonyl precursor.

22. The integrated system of claim 21 further comprising a partition having a valve therein, wherein the partition physically separates the first precursor collection plate from the portion configured to receive the metal carbonyl precursor, and the valve pneumatically couples the first precursor collection plate to the portion.

23. The integrated system of claim 21 further comprising a second precursor collection plate spaced from the first precursor collection plate.

* * * * *